US009146265B2

(12) United States Patent
Sung (10) Patent No.: US 9,146,265 B2
(45) Date of Patent: Sep. 29, 2015

(54) POWER MONITORING DEVICE AND POWER ANALYSIS METHOD

(71) Applicant: Institute For Information Industry, Taipei (TW)

(72) Inventor: Jing-Tain Sung, Taipei (TW)

(73) Assignee: Institute for Information Industry, Taipei (TW)

( * ) Notice: Subject to any disclaimer, the term of this patent is extended or adjusted under 35 U.S.C. 154(b) by 236 days.

(21) Appl. No.: 13/746,524

(22) Filed: Jan. 22, 2013

(65) Prior Publication Data

US 2014/0152463 A1   Jun. 5, 2014

(30) Foreign Application Priority Data

Dec. 3, 2012  (TW) .............................. 101145240 A (51) Int. Cl.
| | |
|---|---|
| *G01R 21/00* | (2006.01) |
| *G01R 22/06* | (2006.01) |
| *G06Q 10/06* | (2012.01) |
| *G06Q 50/06* | (2012.01) |
| *G01R 21/133* | (2006.01) |
| *G01D 9/00* | (2006.01) |

(52) U.S. Cl.
CPC ........ *G01R 22/063* (2013.01); *G06Q 10/06315* (2013.01); *G06Q 50/06* (2013.01); *G01D 9/005* (2013.01); *G01R 21/133* (2013.01)

(58) Field of Classification Search
CPC .......................... G06Q 50/06; G06Q 10/06315
USPC ............... 340/870.02, 657; 370/291; 700/291
See application file for complete search history.

(56) References Cited

U.S. PATENT DOCUMENTS

| | | | | |
|---|---|---|---|---|
| 2011/0185196 | A1* | 7/2011 | Asano et al. | ................... 713/300 |
| 2012/0215369 | A1* | 8/2012 | Desai et al. | ................... 700/291 |
| 2012/0296799 | A1* | 11/2012 | Playfair et al. | ................... 705/37 |

FOREIGN PATENT DOCUMENTS

| | | |
|---|---|---|
| TW | 201104997 A | 2/2011 |
| TW | 201242203 A | 10/2012 |

OTHER PUBLICATIONS

Office Action to the corresponding Taiwan Patent Application No. 101145240 rendered by Taiwan Intellectual Property Office (TIPO) on Aug. 1, 2014, 6 pages (including English translation).

* cited by examiner

*Primary Examiner* — Andrew Bee
(74) *Attorney, Agent, or Firm* — Skaar Ulbrich Macari, P.A.

(57) ABSTRACT

A power monitoring device and a power analysis method are provided. The power monitoring device receives a plurality of pieces of power consumption information from a power meter. The power meter is installed on a power line of an electric device. The power monitoring device stores a piece of power specification information of the power device and a piece of user and environment information associated with the power device, and generates a piece of user behavior feature information according to the plurality of pieces of power consumption information. The power monitoring device retrieves a piece of key feature information from the power specification information, the user and environment information and the user behavior feature information so as to generate an inform message according to the key feature information, and transmit the inform message to a user device associated with the electric device.

16 Claims, 7 Drawing Sheets

POWER MONITORING DEVICE AND POWER ANALYSIS METHOD

PRIORITY

This application claims the benefit of priority based on Taiwan Patent Application No. 101145240 filed on Dec. 3, 2012, which is hereby incorporated by reference in its entirety.

FIELD

The present invention relates to a power monitoring device and a power analysis method thereof. More particularly, the power monitoring device of the present invention can receive a plurality of pieces of power consumption information from a power meter installed on a power line of an electric device, retrieve a piece of key feature information from the plurality of pieces of power consumption information, a piece of power specification information of the electric device and a piece of user and environment information associated with the electric device, and generate and transmit an inform message to a user device associated with the electric device according to the key feature information.

BACKGROUND

As the awareness of energy saving and dioxide emission reduction becomes popular in recent years, some users choose to install power meters on some electric devices having a high power consumption in order to reduce the power consumption. The power meters periodically measures the power consumption and reports the power consumption back to a power monitoring device. The power monitoring device stores power specification information (e.g., an operating status, a maximum power value, a minimum power value and a power value distribution of each of the electric devices), and generates a piece of user behavior feature information (e.g., a using status, a using frequency, a starting time, a stopping time, a continuous use duration, a number of use times per day, a number of use times per week, a number of use times per quarter, a number of use times per year, power consumption each time, power consumption per day, power consumption per week, power consumption per month, and so on) according to the power consumption measured. In this way, the user can be informed of the using conditions and the power consumption per day, per week or per month of the electric devices according to the power specification information and the user behavior feature information.

However, it requires a very large storage space to store the power specification information and all the user behavior feature information. Furthermore, it may take the user considerable time to find a piece of desired or key power consumption information from the massive user behavior feature information.

Accordingly, an urgent need exists in the art to provide a solution capable of retrieving key user behavior feature information from all pieces of user behavior feature information so that only the key user behavior feature information is stored to reduce the information storage amount and increase the retrieving efficiency.

SUMMARY

An objective of the present invention is to provide a power monitoring device and a power analysis method thereof. As compared to the prior art, the power monitoring device of the present invention further stores a piece of user and environment information associated with an electric device and retrieves a piece of key feature information from user behavior feature information, power specification information and the user and environment information. In this way, the present invention only needs to store the key feature information instead of storing all the user behavior feature information. Then, the power monitoring device of the present invention can determine abnormal conditions of the electric device in terms of the power consumption according to the key feature information and inform the user of this in real time. Furthermore, according to the key feature information, the power monitoring device of the present invention can suggest the user how to save energy in use of the electric device and can provide advertisement information and life information related to use of the electric device.

To achieve the aforesaid objective, certain embodiments of the present invention disclose a power monitoring device, which comprises a transceiver, a storage and a processor. The transceiver is communicatively connected to a power meter, and is configured to receive a plurality of pieces of power consumption information from the power meter. The power meter is installed on a power line of an electric device. The storage is configured to store a piece of power specification information of the electric device and a piece of user and environment information associated with the electric device. The processor is electrically connected to the transceiver and the storage, and is configured to generate a piece of user behavior feature information according to the power consumption information, retrieve a piece of key feature information from the power specification information, the user and environment information and the user behavior feature information so as to generate an inform message according to the key feature information, and enable the transceiver to transmit the inform message to a user device associated with the electric device.

Furthermore, certain embodiments of the present invention further disclose a power analysis method for a power monitoring device. The power monitoring device comprises a transceiver, a storage and a processor. The transceiver is communicatively connected to a power meter and receives a plurality of pieces of power consumption information from the power meter. The power meter is installed on a power line of an electric device. The storage stores a piece of power specification information of the electric device and a piece of user and environment information associated with the electric device. The processor is electrically connected to the transceiver and the storage. The power analysis method is executed by the processor and comprises the following steps of: generating a piece of user behavior feature information according to the power consumption information; and retrieving a piece of key feature information from the power specification information, the user and environment information and the user behavior feature information so as to generate an inform message according to the key feature information, and enabling the transceiver to transmit the inform message to a user device associated with the electric device.

The detailed technology and preferred embodiments implemented for the subject invention are described in the following paragraphs accompanying the appended drawings for people skilled in this field to well appreciate the features of the claimed invention.

DETAILED DESCRIPTION

In the following descriptions, the present invention will be explained with reference to example embodiments thereof. It shall be appreciated that, these example embodiments are not intended to limit the present invention to any specific example, embodiments, environments, applications or particular implementations described in these embodiments. Therefore, description of these embodiments is only for purpose of illustration rather than to limit the present invention, and the scope claimed in this application shall be governed by the claims. In addition, in the following embodiments and the attached drawings, elements not directly related to the present invention are omitted from depiction; and dimensional relationships among individual elements in the attached drawings are illustrated only for ease of understanding but not to limit the actual scale.

Figure 1:
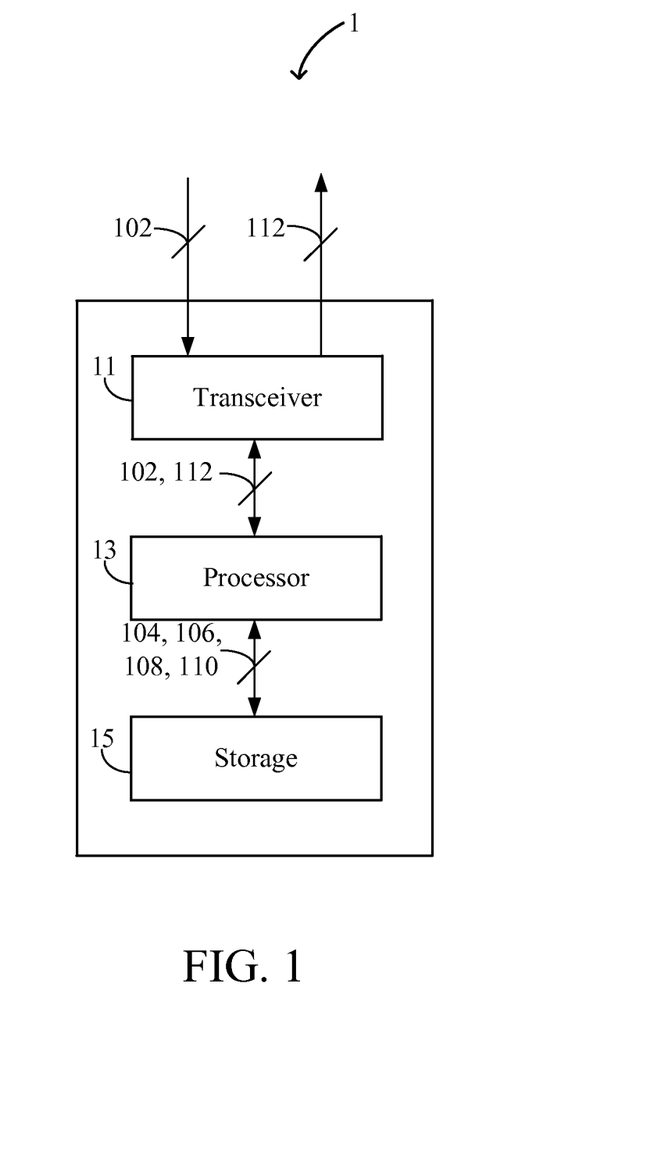
FIG. 1 is a schematic view of a power monitoring device 1 according to a first embodiment of the present invention.

A first embodiment of the present invention is as shown in FIG. 1, which is a schematic view of a power monitoring device 1. The power monitoring device 1 may be a network server, and comprises a transceiver 11, a processor 13 and a storage 15. The transceiver 11 receives a plurality of pieces of power consumption information 102 from a power meter (not shown). The power meter is installed on a power line of an electric device. Specifically, the power meter generates the power consumption information 102 by measuring a voltage value (volt), a current value (ampere), a power value (watt) of the electric device, or a combination thereof at a sample frequency. The transceiver 11 continuously receives the power consumption information 102 from the power meter.

The storage 15 stores a piece of power specification information 104 of the electric device and a piece of user and environment information 106 associated with the electric device. The power specification information 104 may be an operating status, a maximum power value, a minimum power value, a power value distribution, a capacity of the electric device, or any combination thereof. The user and environment information may be a total number of users, a number of males, a number of females, a number of adults, a number of children, a number of aged people, a location of the electric device, a work type, or any combination thereof. The power specification information 104 and the user and environment information 106 may be inputted in advance by a user through a user device (e.g., a smart phone, a tablet computer or a personal computer) communicatively connected to the power monitoring device via the Internet.

The processor 13 generates a piece of user behavior feature information 108 according to the power consumption information 102 and temporarily stores the user behavior feature information 108 into the storage 15. The user behavior feature information 108 may be a using status, a using frequency, a starting time, a stopping time, a continuous use duration, a number of use times per day, a number of use times per week, a number of use times per quarter, a number of use times per year, power consumption each time, power consumption per day, power consumption per week, power consumption per month, or any combination thereof.

Then, the processor 13 retrieves a piece of key feature information 110 from the power specification information 104, the user and environment information 106 and the user behavior feature information 108 so as to generate an inform message 112 according to the key feature information 110, and enables the transceiver 11 to transmit the inform message 112 to a user device associated with the electric device.

As an example, the electric device is an electric kettle. The power specification information 104 comprises operating statuses and a power value distribution of the electric kettle. The operating statuses include a first status (e.g., heat preservation), a second status (e.g., micro heating) and a third status (e.g., boiling). The power value distribution is smaller than 40 watts when corresponding to the first status, is larger than 40 watts but smaller than 600 watts when corresponding to the second status, and is larger than 600 watts when corresponding to the third status.

The user and environment information 106 comprises a total number of people, a location of the electric device and a work type. In this example, the total number of people is 2, the location of the electric device is a kitchen, and the work type is working during the day. The user behavior feature information 108 comprises starting times, stopping times and continuous use durations. Accordingly, the processor 13 generates an information combination as shown in Table 1 according to the aforesaid information.

TABLE 1

| Status | Starting time | Stopping time | Continuous use duration (minute) |
|---|---|---|---|
| 2 | 15:04 | 15:07 | 3 |
| 1 | 15:07 | 15:10 | 3 |
| 2 | 15:10 | 15:13 | 3 |
| 1 | 15:13 | 15:16 | 3 |
| 3 | 15:16 | 15:19 | 3 |
| 2 | 15:19 | 15:31 | 12 |
| 1 | 15:31 | 15:49 | 18 |
| 2 | 15:49 | 15:52 | 3 |
| 1 | 15:52 | 15:55 | 3 |
| 2 | 15:55 | 15:58 | 3 |
| ... | ... | ... | ... |

It shall be appreciated that, the actual data amount is quite large (information of a plurality of days, a plurality of weeks or a plurality of months may be needed depending on frequencies at which different electric devices are used), so only a part of the information is listed in Table 1 for simplicity of description. Next, the processor 13 categorizes the information according to the operating statuses to obtain Table 2, Table 3 and Table 4, and then normalizes the starting times, the stopping times and the continuous use durations on the basis of 24 hours to obtain Table 5, Table 6 and Table 7.

TABLE 2

| Status | Starting time | Stopping time | Continuous use duration (minute) |
|---|---|---|---|
| 1 | 15:04 | 15:07 | 3 |
| 1 | 15:10 | 15:13 | 3 |
| 1 | 15:16 | 15:19 | 3 |
| ... | ... | ... | ... |

TABLE 3

| Status | Starting time | Stopping time | Continuous use duration (minute) |
|---|---|---|---|
| 2 | 15:07 | 15:10 | 3 |
| 2 | 15:13 | 15:16 | 3 |
| 2 | 15:49 | 15:52 | 3 |
| ... | ... | ... | ... |

TABLE 4

| Status | Starting time | Stopping time | Continuous use duration (minute) |
|---|---|---|---|
| 3 | 15:19 | 15:31 | 12 |
| 3 | 17:13 | 17:22 | 9 |
| 3 | 18:03 | 18:15 | 12 |
| ... | ... | ... | ... |

TABLE 5

| Status | Starting time | Stopping time | Continuous use duration |
|---|---|---|---|
| 1 | 0.627778 | 0.629861 | 0.002083 |
| 1 | 0.631944 | 0.634028 | 0.002083 |
| 1 | 0.636111 | 0.638194 | 0.002083 |
| ... | ... | ... | ... |

TABLE 6

| Status | Starting time | Stopping time | Continuous use duration |
|---|---|---|---|
| 2 | 0.629861 | 0.631944 | 0.002083 |
| 2 | 0.634028 | 0.636111 | 0.002083 |
| 2 | 0.659028 | 0.661111 | 0.002083 |
| ... | ... | ... | ... |

TABLE 7

| Status | Starting time | Stopping time | Continuous use duration |
|---|---|---|---|
| 3 | 0.638194 | 0.646528 | 0.008333 |
| 3 | 0.717361 | 0.723611 | 0.00625 |
| 3 | 0.752083 | 0.760417 | 0.008333 |
| ... | ... | ... | ... |

Next, the processor calculates entropies of the normalized starting times, the normalized stopping times and the normalized continuous use durations according to the normalized starting times, the normalized stopping times and the normalized continuous use durations, as shown in Table 8.

TABLE 8

|  | Entropy of the starting times | Entropy of the stopping times | Entropy of the continuous use durations |
|---|---|---|---|
| Status 1 | 9.6673 | 9.6893 | 0.88046 |
| Status 2 | 9.6898 | 9.6669 | 1.1587 |
| Status 3 | 2 | 2 | 1.5 |

Specifically, the processor 13 calculates occurrence probabilities of values of the starting times, occurrence probabilities of values of the stopping times and occurrence probabilities of values of the continuous use durations, and then obtains the entropies of the starting times, the stopping times and the continuous use durations according to the computational formula $$\left( \sum_x p(x) \log \frac{1}{p(x)} \right).$$

Finally, the processor 13 retrieves the key feature information 110 from the starting times, the stopping times and the continuous use durations according to the entropies. As shown in Table 8, the entropy of the continuous use durations in each of the statuses has a smaller value than the entropies of the starting times and the stopping times, so the processor 13 determines that the continuous use durations are relatively important information. Therefore, the key feature information 110 is the operating statuses and the continuous use durations. Accordingly, the processor 13 enables the storage 15 to maintain the information (i.e., the operating statuses and the continuous use durations) in the user behavior feature information 108 that belongs to the key feature information 110 but delete the information (i.e., the starting times and the stopping times) in the user behavior feature information 108 that does not belong to the key feature information 110.

Figure 2:
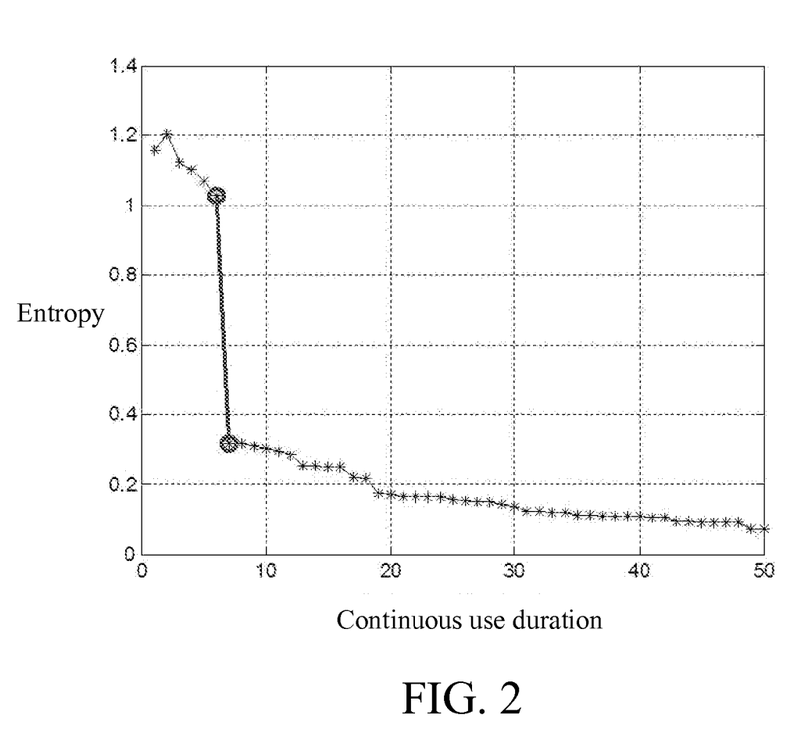
FIG. 2 depicts distribution of entropies of continuous use durations in an example of the present invention.

Furthermore, to make the relationships between the operating statuses and the continuous use durations more significant (i.e., to make the information that can be provided by the key feature information 110 to the user appear more appropriate), the processor 13 decides a quantization value according to the distribution (as shown in FIG. 2) of the entropies of the continuous use durations. In detail, as can be known from the distribution of the entropies of the continuous use durations, the values of the entropies vary greatly between 5 and 6, so the processor 13 selects the larger value as the quantization value (i.e., the quantization value is equal to 6).

Next, the processor 13 decides a quantization interval of the key feature information 110 according to the quantization value. That is, for the continuous use durations, 0 to 5 is a first quantization interval, 6 to 11 is a second quantization interval, 12 to 17 is a third quantization interval, and so on. Accordingly, the processor 13 quantizes the key feature information 110 according to the quantization intervals to obtain that the continuous use durations corresponding to the status 1 are usually within the first interval, the continuous use durations corresponding to the status 2 are usually within the first interval but occasionally within the second interval, and the continuous use durations corresponding to the status 3 are usually within the third interval. Thus, the processor 13 generates the inform message 112 by checking a distribution range (i.e., the quantization intervals corresponding to the statuses) of the quantized key feature information 110, and enables the transceiver 11 to transmit the inform message 112 to the user device of the user.

For example, if the continuous use durations corresponding to the status 3 are beyond the third interval (e.g., 30 minutes), then the processor 13 determines that the electric device is abnormal. Thus, the processor 13 generates the inform message 112 carrying a piece of alert information and enables the transceiver 11 to transmit the inform message 112 to the user device so that the user device can transmit a signal in real time to inform the user of this. For example, the user device may display an alert pattern on a display screen or make a specific sound or the like according to a piece of alert information of the inform message.

It shall be appreciated that, apart from calculating the entropies of the pieces of information, the present invention can also calculate a standard deviation of each of the pieces of information (as shown in Table 9) by means of the principal component analysis approach, and use the information having a smaller standard deviation as the key feature information. How to decide the key feature information through calculation of the standard deviations can be readily known by those of ordinary skill in the art according to the aforesaid example, and thus will not be further described herein.

TABLE 9

|  | Standard deviation of the starting times | Standard deviation of the stopping times | Standard deviation of the continuous use durations |
|---|---|---|---|
| Status 1 | $1.8 \times 10^5$ | $1.8 \times 10^5$ | 15.3 |
| Status 2 | $1.8 \times 10^5$ | $1.8 \times 10^5$ | 37.9 |
| Status 3 | $5.4 \times 10^5$ | $5.5 \times 10^5$ | 15.3 |

Further, although only the information having the minimum entropy or standard deviation is taken as the key feature information in the aforesaid example, the processor 13 takes more than one piece of information having smaller entropies or standard deviations as the key feature information in practical operations. For example, according to the distribution of the entropies or the standard deviations of all the pieces of information, the pieces of information of which the entropies or the standard deviations are smaller than a first quartile or a second quartile (a median) are taken as the key feature information.

Figure 3:
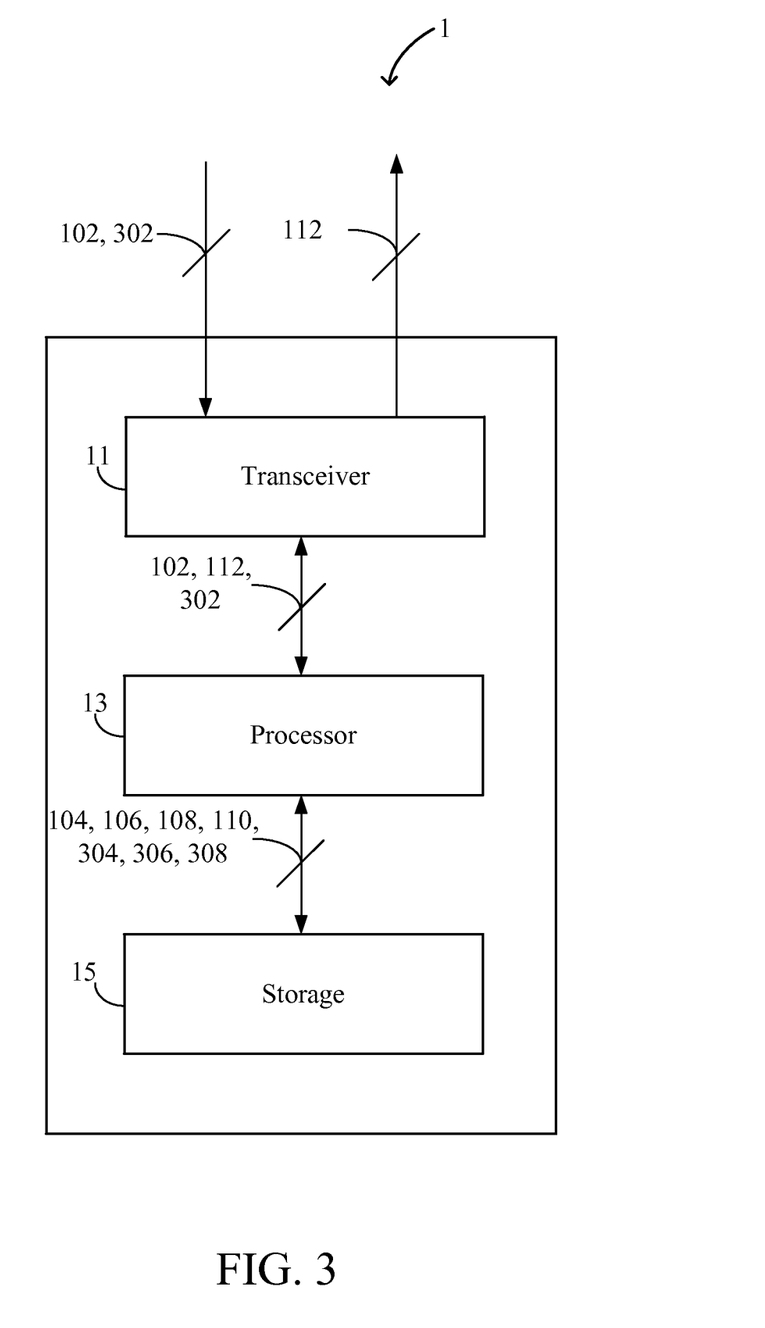
FIG. 3 is a schematic view of a power monitoring device 1 according to a second embodiment of the present invention.

A second embodiment of the present invention is as shown in FIG. 3. As compared to the technical contents described in the first embodiment, the transceiver 11 in the second embodiment further communicatively connects to a reference power meter (not shown) and continuously receives reference power consumption information 302 from the reference power meter. The reference power meter is installed on a power line of a reference electric device. The storage 15 further stores a piece of reference power specification information 304 of the reference electric device and a piece of reference user and environment information 306 associated with the reference electric device.

The processor 13 generates a piece of reference user behavior feature information 308 according to the plurality of pieces of reference power consumption information 302. Then, the processor 13 retrieves the key feature information 110 from the power specification information 104, the reference power specification information 304, the user and environment information 106, the reference user and environment information 306, the user behavior feature information 108 and the reference user behavior feature information 308. Then, the processor 13 generates the inform message 112 according to the key feature information 110. Finally, the processor 13 enables the transceiver 11 to transmit the inform message 112 to the user device.

As an example, the electric device and the reference electric device are each an electric cooker. The power specification information 104 comprises a capacity (e.g., for 3 persons) of the electric cooker, and the reference power specification information 304 comprises a capacity (e.g., for 6 persons) of the reference electric device. The user and environment information 106 comprises a total number of people (e.g., 4 people), and the reference user and environment information 306 comprises a total number of people (e.g., 4 people). The user behavior feature information 108 comprises a continuous use duration (e.g., 20 minutes) and a number of use times per day (e.g., 6 times), and the reference user behavior feature information 308 comprises a continuous use duration (e.g., 35 minutes) and a number of use times per day (e.g., 3 times).

Then, the processor 13 retrieves the key feature information 110 in a similar way to the first embodiment. In this example, supposing that the key feature information 110 is the total number of people and the number of use times per day, then the processor 13 generates an inform message 312 carrying a piece of energy saving suggestion information according to the key feature information 110. For example, if the number of use times per day of the electric device is larger than 3 (i.e., larger than the number of times under the normal condition that a common family uses the electric device once for each of three meals per day), then the processor 13 determines that the user may cause an excessive power consumption due to use of an inappropriate electric device, so the energy saving suggestion information can suggest the user replacing the electric cooker for 3 persons with an electric cooker for 6 persons.

It shall be appreciated that, for simplicity of description, the same kind of electric devices (i.e., the electric cookers) of the two users are used for illustration in the aforesaid example. However, in practical applications, the power monitoring device 1 may receive the power consumption information from more than two users, generate the user behavior feature information, and store the power specification information and the user and environment information so as to retrieve the key feature information from the user behavior feature information, the power specification information and the user and environment information of the electric devices. The user behavior feature information, the power specification information and the user and environment information of the electric devices of a plurality of users are listed in Table 10.

TABLE 10

| User | Capacity of electric device | Total number of people | Continuous use duration | Number of use times per day |
|---|---|---|---|---|
| A | For 6 persons | 4 | 20 minutes | 3 |
| B | For 6 persons | 5 | 30 minutes | 2 |
| C | For 3 persons | 1 | 10 minutes | 1 |
| D | For 6 persons | 6 | 50 minutes | 2 |
| E | For 6 persons | 3 | 5 minutes | 1 |
| F | For 6 persons | 4 | 60 minutes | 1 |
| G | For 6 persons | 2 | 20 minutes | 1 |
| H | For 3 persons | 1 | 20 minutes | 1 |
| ... | ... | ... | ... | ... |

After categorizing the information in Table 10 according to the capacities of the electric devices, the processor 13 can obtain the information as shown in Table 11 and Table 12 respectively. Table 11 shows the information related to the electric devices of which the capacity is for 6 persons, and Table 12 shows the information related to the electric devices of which the capacity is for 3 persons.

TABLE 11

| Total number of people | Continuous use duration | Number of use times per day |
|---|---|---|
| 4 | 20 minutes | 3 |
| 5 | 30 minutes | 2 |
| 6 | 40 minutes | 2 |
| 2 | 20 minutes | 1 |
| 4 | 20 minutes | 1 |
| 2 | 20 minutes | 1 |
| ... | ... | ... |

TABLE 12

| Total number of people | Continuous use duration | Number of use times per day |
|---|---|---|
| 1 | 10 minutes | 1 |
| 1 | 40 minutes | 1 |
| ... | ... | ... |

Then, the processor 13 calculates entropies of the information in Table 11 to obtain that the key feature information of the electric cookers of which the capacity is for 6 persons is the continuous use durations, and calculates entropies of the information in Table 12 to obtain that the key feature information of the electric cookers of which the capacity is for 3 persons is the numbers of use times per day. How to calculate the entropies and how to decide the key feature information according to the values of the entropies can be readily appreciated by those of ordinary skill in the art according to the example in the first embodiment, and thus will not be further described herein.

In addition to the examples described in the first embodiment and the second embodiment, the electric device may also be a television (TV). In this case, the processor 13 can further analyze a program (e.g., a ball game) watched by the user by obtaining that the key feature information is the starting time and the stopping time, and generate and transmit an inform message, which carries advertisement or life information related to the ball game, to the user device of the user.

Figure 4:
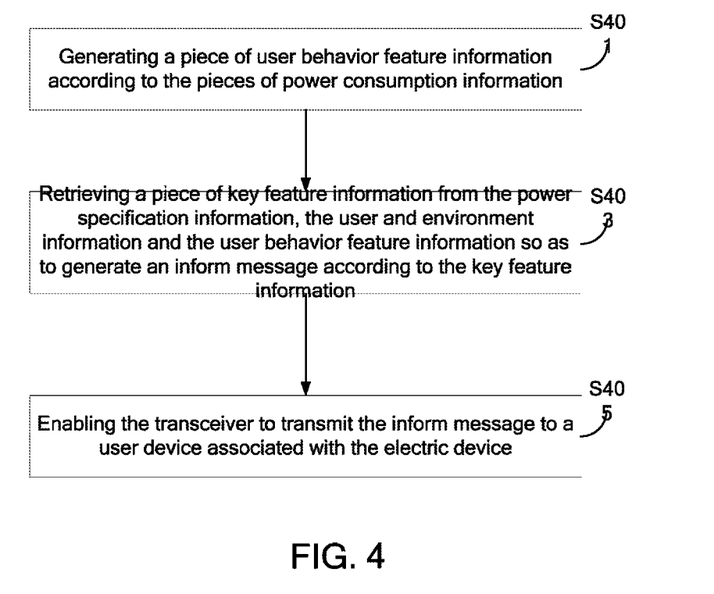
FIG. 4 is a flowchart diagram of a power analysis method according to a third embodiment of the present invention.

A third embodiment of the present invention is as shown in FIG. 4, which is a flowchart diagram of a power analysis method. The power analysis method of this embodiment can be used in a power monitoring device (e.g., the power monitoring device 1 of the first embodiment). The power monitoring device comprises a transceiver, a processor and a storage.

The transceiver is communicatively connected to a power meter and receives a plurality of pieces of power consumption information from the power meter. The power meter is installed on a power line of an electric device. The storage stores a piece of power specification information of the electric device and a piece of user and environment information associated with the electric device. The processor is electrically connected to the transceiver and the storage. The power analysis method of the present invention is executed by the processor.

Firstly, step S401 is executed to generate a piece of user behavior feature information according to the pieces of power consumption information. Then, step S403 is executed to retrieve a piece of key feature information from the power specification information, the user and environment information and the user behavior feature information so as to generate an inform message according to the key feature information. Finally, step S405 is executed to enable the transceiver to transmit the inform message to a user device associated with the electric device.

In addition to the aforesaid steps, the power analysis method of this embodiment can also execute all the operations set forth in the first embodiment and accomplish all the corresponding functions. How the power analysis method of this embodiment executes these operations and accomplishes these functions can be readily appreciated by those of ordinary skill in the art based on the explanation of the first embodiment, and thus will not be further described herein.

Figure 5:
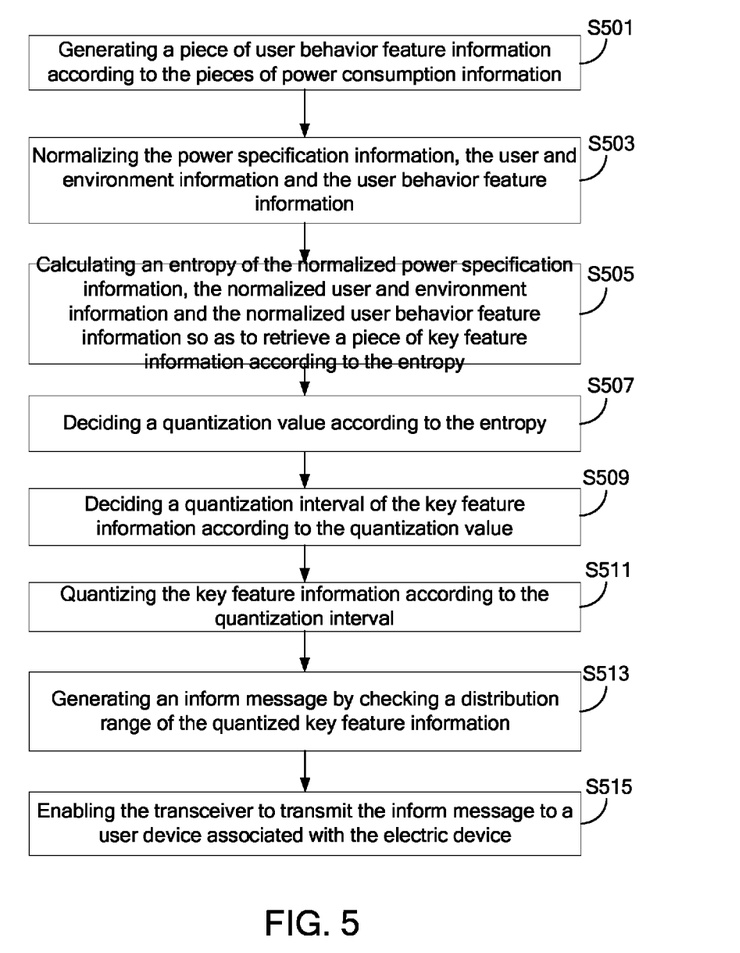
FIG. 5 is a flowchart diagram of a power analysis method according to a fourth embodiment of the present invention.

A fourth embodiment of the present invention is as shown in FIG. 5, which is a flowchart diagram of a power analysis method. The power analysis method of this embodiment can be used in a power monitoring device (e.g., the power monitoring device 1 of the first embodiment). The power monitoring device comprises a transceiver, a processor and a storage. The transceiver is communicatively connected to a power meter and receives a plurality of pieces of power consumption information from the power meter. The power meter is installed on a power line of an electric device. The storage stores a piece of power specification information of the electric device and a piece of user and environment information associated with the electric device. The processor is electrically connected to the transceiver and the storage. The power analysis method of the present invention is executed by the processor.

Firstly, step S501 is executed to generate a piece of user behavior feature information according to the pieces of power consumption information. Step S503 is executed to normalize the power specification information, the user and environment information and the user behavior feature information. Step S505 is executed to calculate an entropy of the normalized power specification information, the normalized user and environment information and the normalized user behavior feature information so as to retrieve a piece of key feature information according to the entropy.

Then, step S507 is executed to decide a quantization value according to the entropy. Step S509 is executed to decide a quantization interval of the key feature information according to the quantization value. Step S511 is executed to quantize the key feature information according to the quantization interval. Then, step S513 is executed to generate an inform message by checking a distribution range of the quantized key feature information. Finally, step S515 is executed to enable the transceiver to transmit the inform message to a user device associated with the electric device.

In addition to the aforesaid steps, the power analysis method of this embodiment can also execute all the operations set forth in the first embodiment and accomplish all the corresponding functions. How the power analysis method of this embodiment executes these operations and accomplishes these functions can be readily appreciated by those of ordinary skill in the art based on the explanation of the first embodiment, and thus will not be further described herein.

Figure 6:
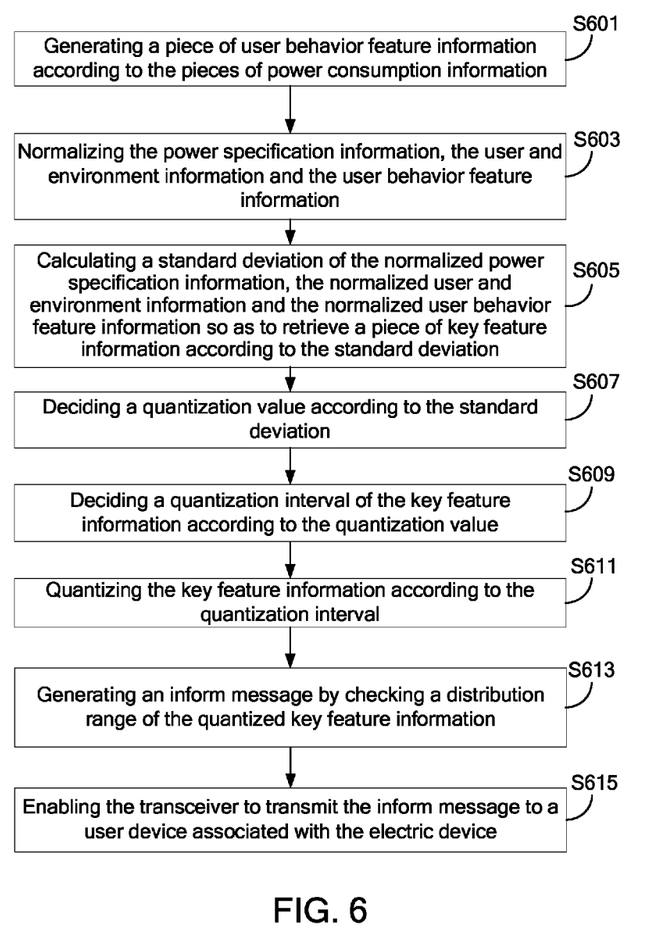
FIG. 6 is a flowchart diagram of a power analysis method according to a fifth embodiment of the present invention.

A fifth embodiment of the present invention is as shown in FIG. 6, which is a flowchart diagram of a power analysis method. The power analysis method of this embodiment can be used in a power monitoring device (e.g., the power monitoring device 1 of the first embodiment). The power monitoring device comprises a transceiver, a processor and a storage. The transceiver is communicatively connected to a power meter and receives a plurality of pieces of power consumption information from the power meter. The power meter is installed on a power line of an electric device. The storage stores a piece of power specification information of the electric device and a piece of user and environment information associated with the electric device. The processor is electrically connected to the transceiver and the storage. The power analysis method of the present invention is executed by the processor.

Firstly, step S601 is executed to generate a piece of user behavior feature information according to the pieces of power consumption information. Step S603 is executed to normalize the power specification information, the user and environment information and the user behavior feature information. Step S605 is executed to calculate a standard deviation of the normalized power specification information, the normalized user and environment information and the normalized user behavior feature information so as to retrieve a piece of key feature information according to the standard deviation.

Then, step S607 is executed to decide a quantization value according to the standard deviation. Step S609 is executed to decide a quantization interval of the key feature information according to the quantization value. Step S611 is executed to quantize the key feature information according to the quantization interval. Then, step S613 is executed to generate an inform message by checking a distribution range of the quantized key feature information. Finally, step S615 is executed to enable the transceiver to transmit the inform message to a user device associated with the electric device.

In addition to the aforesaid steps, the power analysis method of this embodiment can also execute all the operations set forth in the first embodiment and accomplish all the corresponding functions. How the power analysis method of this embodiment executes these operations and accomplishes these functions can be readily appreciated by those of ordinary skill in the art based on the explanation of the first embodiment, and thus will not be further described herein.

Figure 7:
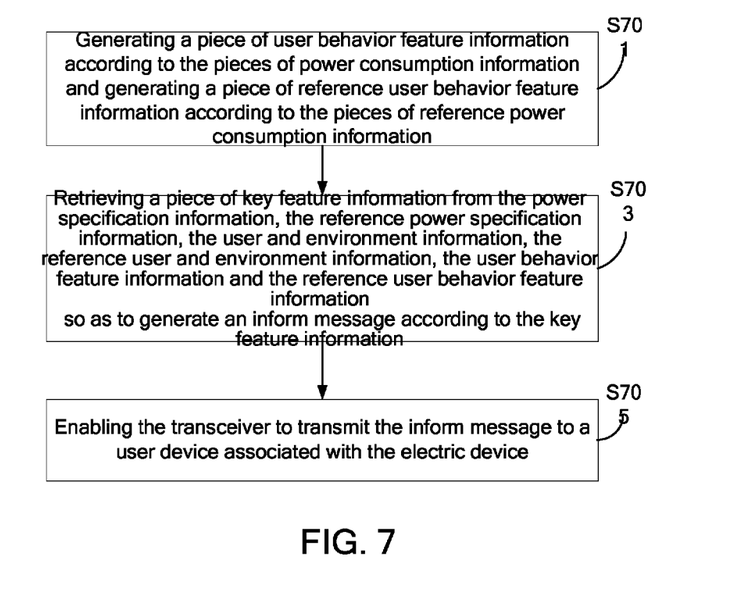
FIG. 7 is a flowchart diagram of a power analysis method according to a sixth embodiment of the present invention.

A sixth embodiment of the present invention is as shown in FIG. 7, which is a flowchart diagram of a power analysis method. The power analysis method of this embodiment can be used in a power monitoring device (e.g., the power monitoring device 1 of the second embodiment). The power monitoring device comprises a transceiver, a processor and a storage.

The transceiver is communicatively connected to a power meter and a reference power meter, and receives a plurality of pieces of power consumption information from the power meter and a plurality of pieces of reference power consumption information from the reference power meter. The power meter is installed on a power line of an electric device, and the reference power meter is installed on a power line of a reference electric device. The storage stores a piece of power specification information of the electric device and a piece of user and environment information associated with the electric device, and stores a piece of reference power specification information of the reference electric device and a piece of reference user and environment information associated with the reference electric device. The processor is electrically connected to the transceiver and the storage. The power analysis method of the present invention is executed by the processor.

Firstly, step S701 is executed to generate a piece of user behavior feature information according to the pieces of power consumption information and generate a piece of reference user behavior feature information according to the pieces of reference power consumption information. Then, step S703 is executed to retrieve a piece of key feature information from the power specification information, the reference power specification information, the user and environment information, the reference user and environment information, the user behavior feature information and the reference user behavior feature information so as to generate an inform message according to the key feature information. Finally, step S705 is executed to enable the transceiver to transmit the inform message to a user device associated with the electric device.

In addition to the aforesaid steps, the power analysis method of this embodiment can also execute all the operations set forth in the second embodiment and accomplish all the corresponding functions. How the power analysis method of this embodiment executes these operations and accomplishes these functions can be readily appreciated by those of ordinary skill in the art based on the explanation of the second embodiment, and thus will not be further described herein.

According to the above descriptions, the power monitoring device of the present invention stores a piece of power specification information and a piece of user and environment information associated with an electric device and retrieves a piece of key feature information from user behavior feature information, the power specification information and the user and environment information. In this way, the present invention only needs to store the key feature information instead of storing all the user behavior feature information.

In addition, the power monitoring device of the present invention can determine abnormal conditions of the electric device in terms of the power consumption according to the key feature information and inform the user of this in real time; or according to the key feature information, the power monitoring device of the present invention can suggest the user how to save energy in use of the electric device and can provide advertisement information and life information related to use of the electric device.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A power monitoring device, comprising:
a transceiver communicatively connected to a power meter, being configured to receive a plurality of pieces of power consumption information from the power meter, the power meter being installed on a power line of an electric device;
a storage, being configured to store a piece of power specification information of the electric device and a piece of user and environment information associated with the electric device; and
a processor electrically connected to the transceiver and the storage, being configured to generate a piece of user behavior feature information according to the power consumption information, to normalize the power specification information, the user and environment information and the user behavior feature information, to calculate an entropy of the normalized power specification information, the normalized user and environment information and the normalized user behavior feature information, to retrieve a piece of key feature information from the power specification information, the user and environment information and the user behavior feature information according to the entropy, to generate an inform message according to the key feature information, and to enable the transceiver to transmit the inform message to a user device associated with the electric device.

2. The power monitoring device as claimed in claim 1, wherein the processor further decides a quantization value according to the entropy and decides a quantization interval of the key feature information according to the quantization value, and the processor further quantizes the key feature information according to the quantization interval and generates the inform message by checking a distribution range of the quantized key feature information.

3. A power monitoring device, comprising:
a transceiver communicatively connected to a power meter, being configured to receive a plurality of pieces of power consumption information from the power meter, the power meter being installed on a power line of an electric device;

a storage, being configured to store a piece of power specification information of the electric device and a piece of user and environment information associated with the electric device; and a processor electrically connected to the transceiver and the storage, being configured to generate a piece of user behavior feature information according to the power consumption information, to normalize the power specification information, the user and environment information and the user behavior feature information, to calculate a standard deviation of the normalized power specification information, the normalized user and environment information and the normalized user behavior feature information, to retrieve a piece of key feature information from the power specification information, the user and environment information and the user behavior feature information according to the standard deviation, to generate an inform message according to the key feature information, and to enable the transceiver to transmit the inform message to a user device associated with the electric device.

4. The power monitoring device as claimed in claim 3, wherein the processor further decides a quantization value according to the standard deviation and decides a quantization interval of the key feature information according to the quantization value, and the processor further quantizes the key feature information according to the quantization interval and generates the inform message by checking a distribution range of the quantized key feature information.

5. The power monitoring device as claimed in claim 3, wherein each of the plurality of pieces of power consumption information is a power value at a time point.

6. The power monitoring device as claimed in claim 5, wherein the power specification information is selected from a group consisting of an operating status, a maximum power value, a minimum power value, a power value distribution and a capacity of the electric device.

7. The power monitoring device as claimed in claim 6, wherein the user and environment information is selected from a group consisting of a total number of people, a number of males, a number of females, a number of adults, a number of children, a number of aged people, a location of the electric device and a work type.

8. The power monitoring device as claimed in claim 7, wherein the user behavior feature information is selected from a group consisting of a using status, a using frequency, a starting time, a stopping time, a continuous use duration, a number of use times per day, a number of use times per week, a number of use times per quarter, a number of use times per year, power consumption each time, power consumption per day, power consumption per week and power consumption per month.

9. A power analysis method for a power monitoring device, the power monitoring device comprising a transceiver, a storage and a processor, the transceiver being communicatively connected to a power meter and receiving a plurality of pieces of power consumption information from the power meter, the power meter being installed on a power line of an electric device, the storage storing a piece of power specification information of the electric device and a piece of user and environment information associated with the electric device, the processor being electrically connected to the transceiver and the storage, and the power analysis method being executed by the processor and comprising the following steps of:

generating a piece of user behavior feature information according to the power consumption information;

normalizing the power specification information, the user and environment information and the user behavior feature information;

calculating an entropy of the normalized power specification information, the normalized user and environment information and the normalized user behavior feature information;

retrieving a piece of key feature information from the power specification information, the user and environment information and the user behavior feature information according to the entropy;

generating an inform message according to the key feature information; and enabling the transceiver to transmit the inform message to a user device associated with the electric device.

10. The power analysis method as claimed in claim 9, further comprising the following steps of:

deciding a quantization value according to the entropy;

deciding a quantization interval of the key feature information according to the quantization value;

quantizing the key feature information according to the quantization interval; and generating the inform message by checking a distribution range of the quantized key feature information.

11. A power analysis method for a power monitoring device, the power monitoring device comprising a transceiver, a storage and a processor, the transceiver being communicatively connected to a power meter and receiving a plurality of pieces of power consumption information from the power meter, the power meter being installed on a power line of an electric device, the storage storing a piece of power specification information of the electric device and a piece of user and environment information associated with the electric device, the processor being electrically connected to the transceiver and the storage, and the power analysis method being executed by the processor and comprising the following steps of:

generating a piece of user behavior feature information according to the power consumption information;

normalizing the power specification information, the user and environment information and the user behavior feature information;

calculating a standard deviation of the normalized power specification information, the normalized user and environment information and the normalized user behavior feature information;

retrieving a piece of key feature information from the power specification information, the user and environment information and the user behavior feature information according to the standard deviation;

generating an inform message according to the key feature information; and enabling the transceiver to transmit the inform message to a user device associated with the electric device.

12. The power analysis method as claimed in claim 11, further comprising the following steps of:

deciding a quantization value according to the standard deviation;

deciding a quantization interval of the key feature information according to the quantization value;

quantizing the key feature information according to the quantization interval; and generating the inform message by checking a distribution range of the quantized key feature information.

13. The power analysis method as claimed in claim 11, wherein each of the plurality of pieces of power consumption information is a power value at a time point.

14. The power analysis method as claimed in claim 13, wherein the power specification information is selected from a group consisting of an operating status, a maximum power value, a minimum power value, a power value distribution and a capacity of the electric device.

15. The power analysis method as claimed in claim 14, wherein the user and environment information is selected from a group consisting of a total number of people, a number of males, a number of females, a number of adults, a number of children, a number of aged people, a location of the electric device and a work type.

16. The power analysis method as claimed in claim 15, wherein the user behavior feature information is selected from a group consisting of a using status, a using frequency, a starting time, a stopping time, a continuous use duration, a number of use times per day, a number of use times per week, a number of use times per quarter, a number of use times per year, power consumption each time, power consumption per day, power consumption per week and power consumption per month.

* * * * *